United States Patent
Scherrer et al.

(10) Patent No.: US 6,943,631 B2
(45) Date of Patent: Sep. 13, 2005

(54) DC-COUPLED MULTI-STAGE AMPLIFIER USING ALL-PASS RESISTIVE/CAPACITIVE NETWORK FOR LEVEL SHIFTING

(75) Inventors: Daniel R. Scherrer, Santa Rosa, CA (US); Jason R. Breitbarth, Boulder, CO (US); David P. Schmelzer, Santa Barbara, CA (US); Morgan K. Culver, Petaluma, CA (US); Donald C. D'Avanzo, Jr., Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 71 days.

(21) Appl. No.: 10/746,666

(22) Filed: Dec. 23, 2003

(65) Prior Publication Data

US 2005/0134389 A1      Jun. 23, 2005

(51) Int. Cl.[7] .............................. H03F 3/68; H03F 3/60; H03F 3/191
(52) U.S. Cl. ....................... 330/310; 330/286; 330/302
(58) Field of Search .......................... 326/68; 327/333; 330/133, 277, 286, 302, 306, 307, 310

(56) References Cited

U.S. PATENT DOCUMENTS

| 6,236,266 B1 * | 5/2001 | Choumei et al. ............ 330/133 |
| 6,278,328 B1 * | 8/2001 | Yamamoto et al. ......... 330/298 |
| 6,329,879 B1 * | 12/2001 | Maruyama et al. ......... 330/289 |

* cited by examiner

Primary Examiner—Steven J. Mottola

(57) ABSTRACT

A resistive level-shifting biasing network is used with a capacitor in parallel to couple FET-based amplifier stages from DC to several GHz in a multi-stage amplifier. The output of the first amplifier stage is connected to the input of the second amplifier stage without a blocking capacitor or level-shifting diodes, allowing a portion of the drain current for the first amplifier stage to be supplied from the second amplifier stage. In a particular embodiment, a distributed amplifier achieved over 20 dB gain from DC to about 80 GHz using three traveling wave amplifier chips.

19 Claims, 4 Drawing Sheets

DC-COUPLED MULTI-STAGE AMPLIFIER USING ALL-PASS RESISTIVE/CAPACITIVE NETWORK FOR LEVEL SHIFTING

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates generally to high-frequency amplifiers, and more particularly to biasing amplifier stages in a multi-stage amplifier using an integrated, resistive level-shifting network.

BACKGROUND OF THE INVENTION

Broadband amplification (generally from less than 100 MHz to greater than 75 GHz) is desired for many applications, such as microwave and optical communication networks and test and measurement equipment. Gain of approximately 20–30 dB is desirable to obtain moderate power levels (typically about 10 to 30 dBm) for electrical signals. Distributed amplifier integrated circuits ("ICs"), particularly those using gallium arsenide ("GaAs") and/or indium phosphide ("InP") transistors, are often used as gain elements in these types of systems. Distributed amplifiers provide good input and output impedance matching and moderate output power over a wide frequency range.

Multi-stage amplifiers cascade a series of distributed amplifiers ("amplifier stages"), often provided as unpackaged semiconductor ICs (also known as "chips"), to achieve higher gain. Gain of 20 to 30 dB is often obtained with multi-stage amplifiers. The gain of the multi-stage amplifier depends on the gain per amplifier stage and number of amplifier stages in the cascade, as well as other factors. However, cascading amplifier stages can be difficult due to the incompatibility of the bias levels of the output of one amplifier stage with the input of the next amplifier stage.

An example of a distributed amplifier is an integrated, monolithic semiconductor traveling wave amplifier ("TWA"). Three to ten active gain cells distributed along two transmission lines on a semiconductor chip are typically used in a TWA. One transmission line is the input transmission line and the other transmission line is the output transmission line. Each of these transmission lines is terminated in a resistor having the same value as a characteristic impedance (e.g. 50 ohms) of the transmission line. These resistors are referred to as the input termination and output termination. The active gain cells are often FETs, which are arranged in a cascode configuration. GaAs depletion-mode FETs are often used as the gain cells in distributed amplifiers because they provide a good combination of gain, high-frequency performance, and power.

For purposes of this discussion, a cascode configuration of depletion-mode FETs can be represented as a single common source FET, since the electrical characteristics of the two are similar. If the distributed amplifier consists of 7 FETs, each having a width of 50 microns, the lumped equivalent will be represented as a single FET having a width of 350 microns.

The input signal to the distributed amplifier is coupled to the gate of the first FET (active gain stage), which is typically biased at a slight negative voltage (about −0.3 V) and draws a very small amount of current (typically<0.1 mA). The signal is amplified by the FET and the output signal is taken from the drain of the FET, which is typically biased at a positive voltage (about 4V) and draws a significant amount of current (typically 75 mA-500 mA or more). The output signal is coupled to the input of the next amplifier stage; however, the bias point (4V) of the drain of the first amplifier stage is not compatible with the bias point (−0.3V) of the second amplifier stage. Multi-stage amplifiers often use either DC blocks (capacitors) or level-shifting networks to resolve incompatible bias levels for the output of a preceding amplifier stage and the input of a following amplifier stage.

A common technique is to use a broadband blocking capacitor to isolate the output bias of one amplifier stage from the input bias of the next amplifier stage. Drain current is provided to the output of the first amplifier stage through a broadband inductor.

FIG. 1A shows a circuit diagram of a portion of a prior art multi-stage amplifier 10 using capacitively coupled amplifier stages 12, 14 (represented as FETs). A blocking capacitor 16 blocks DC from the drain 18 of the first amplifier stage 12 to the gate 20 of the second amplifier stage 14. Drain bias voltage $V_D$ is supplied to the drain 18 of the first amplifier stage 12 through an inductor 22. A large capacitor 30 (typically greater than 100 pF) coupled to the drain 12 through a 50 ohm output termination resistor 26. The combination of the capacitor 30 and output termination resistor 26 provides a good termination for the drain 12 at both low and high frequencies. The value of the output termination resistor is chosen according to a characteristic impedance of the system that the multi-stage amplifier 10 is intended for use in. A 50 ohm termination is appropriate for use in a 50-ohm system, but this characteristic impedance is chosen merely as an example for convenience of discussion. Resistors 32, 34 form a voltage divider for biasing the gate 22 of the second amplifier stage 14.

Unfortunately, the capacitor 16 blocks low-frequency and DC signals in addition to the drain bias voltage $V_D$. Generally, a larger capacitor will couple lower frequencies; however, it is also more likely to have a lower self-resonant frequency. Similarly, the inductor 22 often has resonant frequencies that affect the signal between amplifier stages, and broadband resonance-free inductors are expensive.

FIG. 1B shows a circuit diagram of a portion of another prior art multi-stage amplifier 40 using capacitively coupled amplifier stages 12, 14. Rather than using a broad-band inductor (see FIG. 1A, ref. num. 22), bias current is provided to the first amplifier stage 12 through a 50 ohm output termination resistor 26 by a voltage supply 42. A blocking capacitor 16' isolates the drain bias 42 of the first amplifier stage 12 from the gate bias 44 of the second amplifier stage 14. The drain current for the first amplifier stage 12 flows through the output termination resistor 26, which is usually integrated on the semiconductor chip of the first amplifier stage 12. The voltage drop across the output termination resistor 26 is typically about 5 Volts. This generates significant power (e.g. 5V*100 mA=0.5 W) and raises the operating temperature of the first amplifier stage 12. Higher operating temperatures often result in earlier failures, especially with physically small resistors. Unfortunately, physically large resistors do not work well at high frequencies due to parasitic reactance.

FIG. 1C shows a circuit diagram of a portion of yet another prior art multi-stage amplifier 46. Level-shift diodes D1, D2, D3, D4 are used to shift the bias level from the drain 18 of the first amplifier stage 12 to the gate 20 of the second amplifier stage 14. As in the multi-stage amplifier shown in FIG. 1B, the drain current flows from the drain bias 42 through the output termination resistor 26. The drain bias 42 also forward biases the level-shift diodes D1, D2, D3, D4. However, the level-shift diodes D1, D2, D3, D4 have parasitic inductances and capacitances that create resonances at high frequency signals. An optional current source 47 is included to insure that a few milliamps are pulled through the level-shift diodes D1, D2, D3, D4. This also insures that a selected amount of current is pulled through the input termination resistor 48.

A "speed-up" capacitor 49 provides a low-impedance path for high-frequency signals, typically above 500 MHz, between the drain 18 of the first amplifier stage 12 and the gate 20 of the second amplifier stage 14. Below about 50 MHz, the capacitor does not couple the drain 12 to the gate 22, and the signal from the drain 12 passes to the gate 22 through the level-shift diodes D1, D2, D3, D4. Coupling the first amplifier stage 12 to the second amplifier stage 14 as shown often results in higher gain at low frequencies, and lower gain at high frequencies, rather than flat gain across the bandwidth of the multi-stage amplifier 46.

Thus, it is desirable to couple amplification stages in a multi-stage amplifier to allow amplification of low-frequency signals without degrading the high-frequency performance of the distributed amplifier and at the same time to provide level shifting to resolve the incompatibility in biasing levels between the output of one amplifier stage and the input of the next amplifier stage. It is also desirable to provide drain current to an amplifier stage in a manner that avoids the disadvantages discussed above.

BRIEF SUMMARY OF THE INVENTION

A multi-stage amplifier includes a first amplifier stage having a first output configured to be coupled to an output bias supply through an output termination resistor and a second amplifier stage having an input coupled to the first output and a gate coupled to the input through a first integrated high-impedance resistor in parallel with an integrated capacitor. The gate is configured to be coupled to a gate bias voltage supply through a second integrated high-impedance resistor. The first integrated high-impedance resistor and the second integrated high-impedance resistor form a resistive level-shifting network to bias the gate at a selected gate bias voltage, and to couple direct-current signals from the first output to the gate of the second amplifier stage. The input of the second amplifier stage is coupled to the output bias supply through an input termination resistor and provides a portion of the drain current to the preceding (first) amplifier stage.

In a particular embodiment, the capacitance of the integrated capacitor is chosen to be about equal to an input capacitance of the gate to form a capacitive divider at the gate, and the resistances of the first and second high-impedance integrated resistors are chosen to be essentially equal to form a resistive divider at the gate. In a further embodiment, the resistance of the first integrated resistor is selected to be at least five times the characteristic impedance of the multi-stage amplifier so that the resistive network does not load the capacitive coupling path at high frequencies.

DETAILED DESCRIPTION OF THE EMBODIMENTS

I. Introduction

Cascaded amplifier stages are DC-coupled in a multi-stage amplifier. Bias current to a first amplifier stage is provided through both the output termination resistor of the first amplifier stage and the input termination resistor of the following amplifier stage. Thus, in a 50-ohm system, drain current for the first amplifier stage is provided through 25 ohms, which is the parallel combination of a 50 ohm output termination of the first amplifier stage and the 50 ohm input termination of the following amplifier stage. This results in lower power dissipation than providing bias current through only the output termination resistor. Resistors and a capacitor integrated on the amplifier chip provide a level-shifting network to bias a gate of the following amplifier stage and to couple the output of the first amplifier stage to the gate of the following amplifier stage from DC to several GHz.

II. Exemplary Multi-Stage Amplifier

Figure 2:
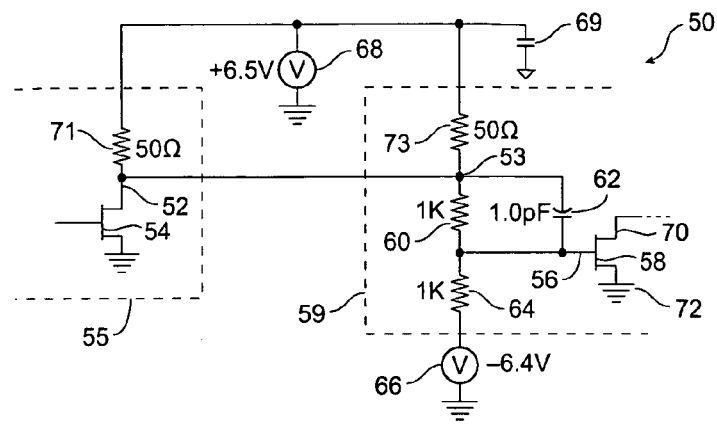
FIG. 2 is a simplified circuit diagram of a portion of a multi-stage amplifier according to an embodiment of the present invention.

FIG. 2 is a simplified circuit diagram of a portion of a multi-stage amplifier ("amplifier") 50 according to an embodiment of the present invention. The amplifier stages 55, 59 (which are represented as dotted lines to indicate semiconductor chips) include TWAs 54, 58, which are drawn as FETs. Each TWA typically includes 3–10 FETs (not individually shown). It is common in the art to represent the gain of the distributed gain elements of a TWA in a circuit diagram with the same symbol used for a FET. Representing the gain of a TWA as a FET also simplifies the illustration of the bias techniques of the multi-stage amplifier.

The drain (output) 52 of the first amplifier stage 55 is coupled to the input 53 of the second amplifier stage 59. The input 53 of the second amplifier stage 59 is coupled to the gate 56 of the second TWA 58 through a resistor 60 and a capacitor 62 in parallel with the resistor 60. Another resistor 64 couples the gate 56 of the first TWA 58 to a gate bias supply 66. The resistors 60, 64 and capacitor 62 are integrated on the semiconductor chip of the second amplifier stage 59. A relatively large negative voltage is provided by power supply 66 to counteract a relative large positive voltage provided by power supply 68 and result in essentially zero volts at the gate 56.

Figure 1A:
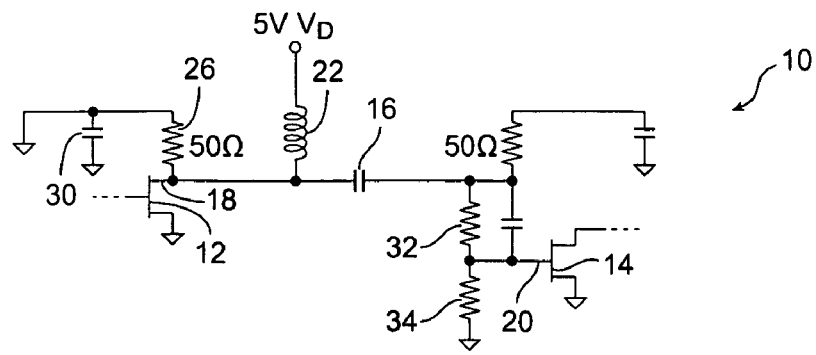
FIG. 1A shows a circuit diagram of a portion of a prior art multi-stage amplifier using capacitively coupled amplifier stages.
Figure 1B:
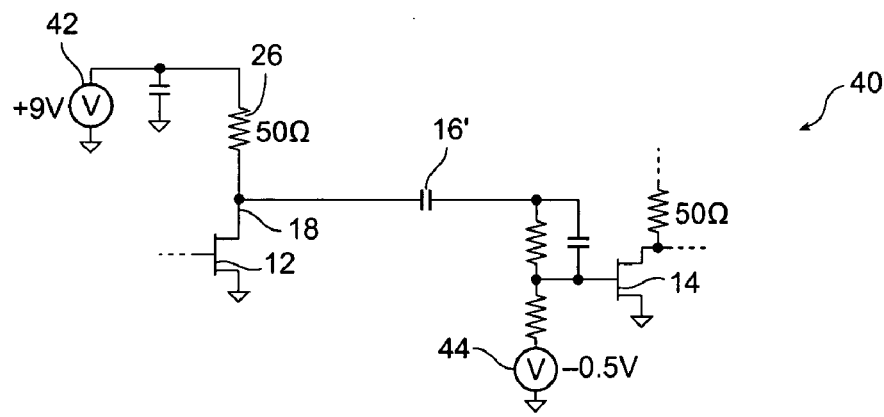
FIG. 1B shows a circuit diagram of a portion of another prior art multi-stage amplifier using capacitively coupled amplifier stages.
Figure 1C:
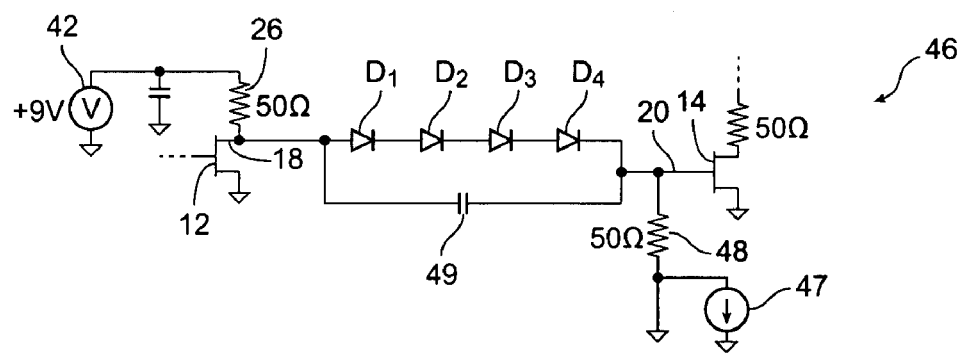
FIG. 1C shows a circuit diagram of a portion of yet another prior art multi-stage amplifier.

The voltage supplies 66, 68 and capacitor 69 are located off-chip. Furthermore, the voltage supplies are typically not part of the multi-stage amplifier (see, e.g. FIG. 3B). Bias voltage(s) are brought into a packaged multi-stage through feedthrough pins. The voltage supplies are shown in the figures for convenience of illustration and discussion. Approximately half the drain current for the first amplifier stage 55 is supplied from the output bias supply 68 through the output termination resistor 71 of the first amplifier stage 55, and the remainder of the drain current is supplied through the input termination resistor 73 of the second amplifier stage 59. This reduces the problems arising from heat generation in the prior art multi-stage amplifiers shown in FIGS. 1B and 1C in two ways. First, the parallel combination of resistors provides an equivalent resistance of 25 ohms, reducing Joule heating. Second, the heat generated by the drain current is physically spread out, with about half the heat being generated on the first amplifier chip, and about half the heat being generated on the second amplifier chip.

Integrated resistors 60, 64 form a level-shifting network between the drain 52 of the first TWA 54 and the gate 56 of the second TWA 58. The resistors 60, 64 have relatively high resistance relative to the characteristic impedance of the multi-stage amplifier 50 (e.g. 50 ohms). It is generally desirable that each resistor in the bias level-shifting network have a resistance at least five times the characteristic impedance of the system to prevent the low-frequency path (i.e. resistors 60, 64) from interfering with the high frequency path (i.e. capacitor 62). In a particular embodiment, each resistor 60, 64 was about 1,000 ohms, which was selected to provide sufficient current through the resistors so that the current through the gate 56 was negligible (about 2%) and so that the resistive network did not load the capacitive coupling to the gate at high frequencies.

The voltage supplies 66, 68 maintain a slight negative voltage (e.g. about –0.2 V in this example) at the gate 56 of the second TWA 58 and provide a coupling path for DC and low-frequency signals from the first amplifier stage 55. Voltage supplies are optionally auto-sensing or externally controlled to maintain the desired voltages. For example, an operational amplifier is used to sense the current drawn through the second TWA 58 (i.e. from the drain 70 to ground 72). The gate 56 can be drawn to a negative voltage using this level-shifting network. For example, reducing the resistance of the second integrated resistor 64 relative to the first integrated resistor 60 pulls the gate voltage lower.

Even though the resistances of the level-shifting network are fixed in the semiconductor die, the gate bias voltage also depends on the voltage of voltage supplies 66, 68. Thus, the level shift is adjustable, which enables the TWA 58 to be used in a wide variety of applications.

The integrated resistors 60, 64 and integrated capacitor 62 typically have very small parasitic reactances. In a particular embodiment the resistors 60, 64 have self-resonant frequencies greater than 200 GHz. It is generally desirable that the integrated resistors have self-resonant frequencies above the intended operating range of the amplifier stage.

The integrated resistors 60, 64 provide a level-shifting path from the drain 52 of the first TWA 54 to the gate 56 of the second TWA 58 from DC up to about 10 MHz, depending on the value chosen for the capacitor 62. The capacitor 62 forms a capacitive divider with the input capacitance of the second TWA 58. In a particular embodiment, the capacitor 62 is about 700 femto-Farads ("fF") and the input capacitance is about 700 fF. The capacitance of the combination of the integrated capacitor and input capacitance and is approximately half the input capacitance, which improves the bandwidth of the distributed amplifier while still allowing large (i.e. wide) FETs to but used to achieve higher output power. The capacitive divider couples approximately half of the dynamic voltage from the output 52 of the first TWA 54 to the gate 56 of the second TWA 58.

The high-impedance level-shifting restive network formed by the integrated resistors 60, 64 does not significantly load the gate 56 of the second TWA 58 at high frequencies. The transition from the low-frequency region (typically below about 10 MHz), where coupling between the TWAs is dominated by the high-impedance resistive level-shifting network and the high-frequency region (typically above 500 MHz), where coupling between the TWAs is dominated by the low-impedance of capacitor 62, is smooth. In a particular embodiment, where each integrated resistor had a resistance of about 1,000 ohms and the integrated capacitor 62 had a capacitance about equal to the input capacitance of the TWA 58, less than 1 dB of gain variation ("ripple") of the amplifier stage occurred in the transition between the low-frequency region and high-frequency region.

Suitably high values for the resistors in the level-shifting network are chosen so as to not interfere with the capacitive path at high frequencies. High resistance values isolate the DC path from high-frequency signals. In other words, higher values of resistance move the cutoff (transition) frequency lower, but leakage current through the gate 56 can shift the gate bias voltage. Therefore, it is desirable that sufficient current flow through the integrated resistors 60, 64 so that the gate current draw is negligible, typically less than about 2%, of the current flowing through the integrated resistors 60, 64. Resistors in the range of 1 to 10 kilo-ohms are suitable for use with depletion-mode FETs made according to a pseudomorphic high-electron mobility transistor ("PHEMT") process.

Figure 3A:
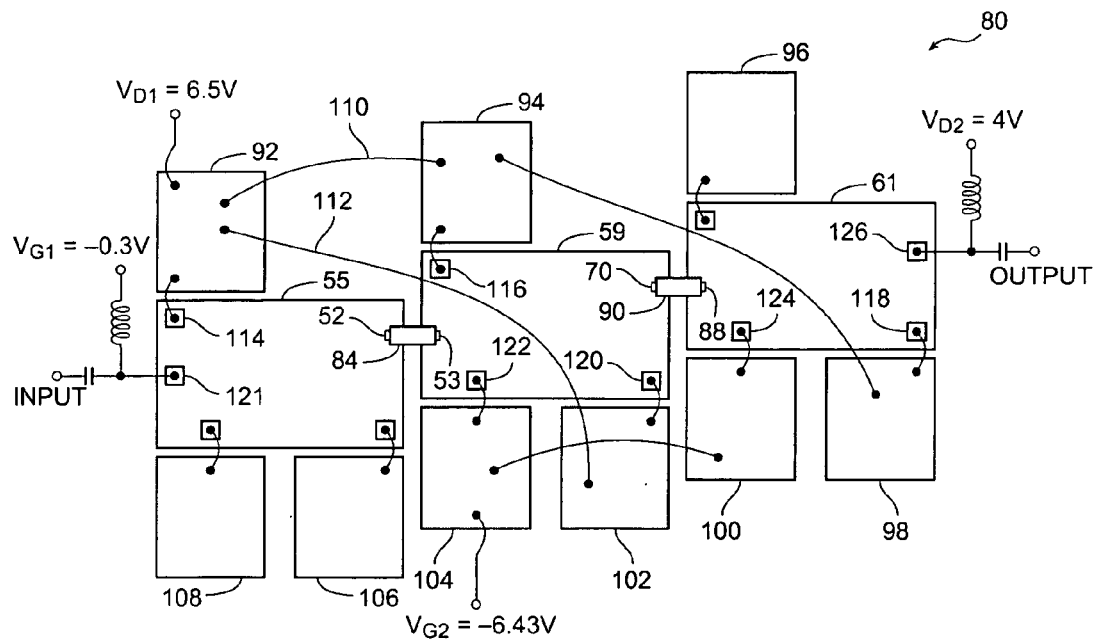
FIG. 3A is a plan view of a multi-stage amplifier using three cascaded TWA chips according to an embodiment of the present invention.

FIG. 3A is a plan view of a multi-stage amplifier 80 using three cascaded amplifier stages 55, 59, 61 fabricated in a 0.15 micron (gate length) PHEMT process according to an embodiment of the present invention. Each amplifier stage includes a TWA and is fabricated on a chip of GaAs. The output 52 of the first amplifier stage 55 is connected to the input 53 of the second amplifier stage 59 with a mesh bond 84, ribbon bond, or wire bonds. Similarly, the output 70 of the second amplifier stage 59 is connected to the input 88 of the third amplifier stage 61 with a mesh bond 90 or other bond.

Drain bias voltage $V_{D1}$ is brought to a plate of a chip capacitor 92, which typically has relatively high capacitance and a high self-resonant frequency. The chip capacitor 92 provides a low-impedance path to ground, essentially a shunt, for signals above about 100 MHz. The opposite plate of the chip capacitor 92 is coupled to package ground (not shown) with conductive epoxy or solder. Similarly, chip capacitors 94, 96, 98, 100, 102, 104, 106, 108 act as shunts to ground at high frequencies. In a particular embodiment these chip capacitors have a capacitance of about 800 pico-Farads ("pF").

$V_{D1}$ is distributed from the chip capacitor 92 to other chip capacitors 94, 98, 102 with bond wires 110, 112, which in turn couple $V_{D1}$ to the amplifier stages 55, 59, 61 at bonding pads 114, 116, 118, and 120. The bonding pads correspond to the like-numbered nodes shown in FIG. 3B. The gate bias voltage $V_{G1}$ for the first amplifier stage 55 is about −0.2 V, and is supplied to the input bonding pad 121 of the first amplifier stage 55 through an inductor 83. Gate bias $V_{G2}$=−6.43 V for the second amplifier stage 59 is provided at bonding pad 122 and to the third amplifier stage 61 at bonding pad 124. Since the third amplifier stage 61 does not have a following amplifier stage, the drain current is provided by $V_{D2}$=4 V through an inductor 85 coupled to the output bonding bad 126. The output termination resistor (see FIG. 3B, ref. num. 87) for the third (final) amplifier stage 61 couples frequencies above about 100 MHz to ground thorough a capacitor 96.

Although a 3-stage amplifier assembly is shown, additional amplifier stages are included in alternative embodiments. Similarly, each of the three amplifier chips illustrated in this embodiment are identical, but this is not required. For example, the first amplifier chip may be optimized for gain, while the third amplifier chip is optimized for output power. Alternatively, the first amplifier stage may omit the resistive level-shifting network because gate bias for the first stage is supplied though the inductor 83, for example.

Figure 3B:
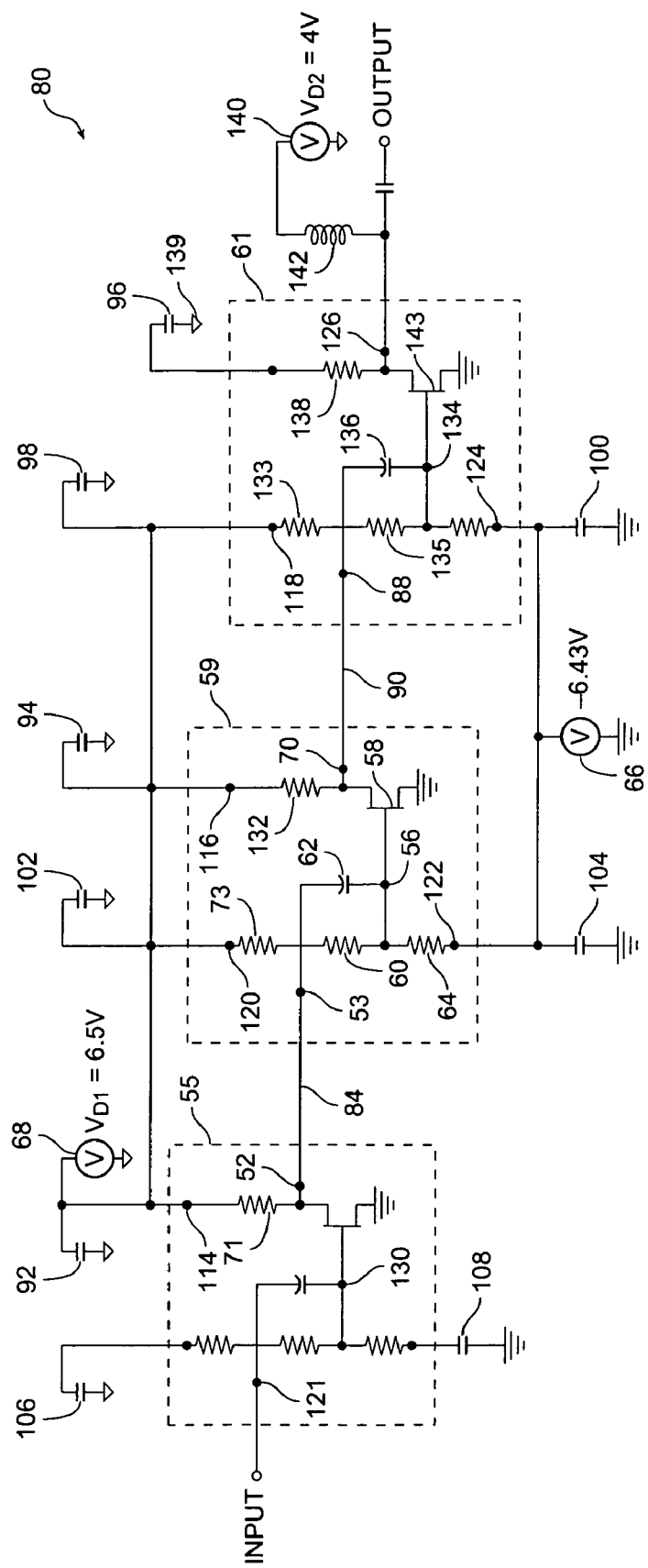
FIG. 3B is a simplified circuit diagram of the multi-stage amplifier shown in FIG. 3A.

FIG. 3B is a simplified circuit diagram of the multi-stage amplifier 80 shown in FIG. 3A. The first, second, and third amplifier stages 55, 59, 61 are IC's fabricated on separate GaAs chips. The first amplifier stage 55 includes a first input 121 configured to be coupled to a first gate bias supply (see FIG. 3A). A first gate 130 is coupled to the first input 121. A first integrated output termination resistor 71 couples a first output 52 to an output bias supply 68. A portion of the drain current to the first amplifier stage is provided through the first output termination resistor 71, and additional drain current to the first amplifier stage is provided through the integrated input termination resistor 73 of the second amplifier stage 59, which is also coupled to the output bias supply 68.

An input 53 of the second amplifier stage 59 is coupled to the first output 52, which is coupled to the second gate 56 through a first integrated high-impedance resistor 60 having a first resistance greater than at least five times a characteristic impedance of the multi-stage amplifier and a parallel integrated capacitor 62. The second gate 56 is coupled to the second gate bias supply 66 through the second integrated high-impedance resistor 64. Drain current from the output bias supply 68 is provided to the second output 70 of the second amplifier stage 59 through a second integrated output termination resistor 132, and through a third integrated input termination resistor 133, which is also coupled to the output bias supply 68. In a particular embodiment, the resistance of the first and second integrated high-impedance resistors are selected to provide a current from the second input to the gate bias supply of at least fifty times the gate current of the TWA 58.

The third amplifier stage 61 has a third input 88 coupled to the second output 70. The third gate 134 is coupled to the third input 88 with a third integrated high-impedance resistor 135 having a third resistance greater than at least five times a characteristic impedance of the multi-stage amplifier in parallel with a second integrated capacitor 136. The third gate 113 is coupled to the second gate bias supply 66 through a fourth integrated high-impedance resistor 137. The third output 126 is coupled to ground 139 through a third integrated output termination resistor 138 and an output coupling capacitor 96. The third output 126 is coupled to a second output bias supply 140 through a wide-band inductor 142. Alternatively, the third output 126 is connected $V_{D1}$ through the third output termination resistor 138 and the inductor 142 and $V_{D2}$ are omitted.

Figure 4A:
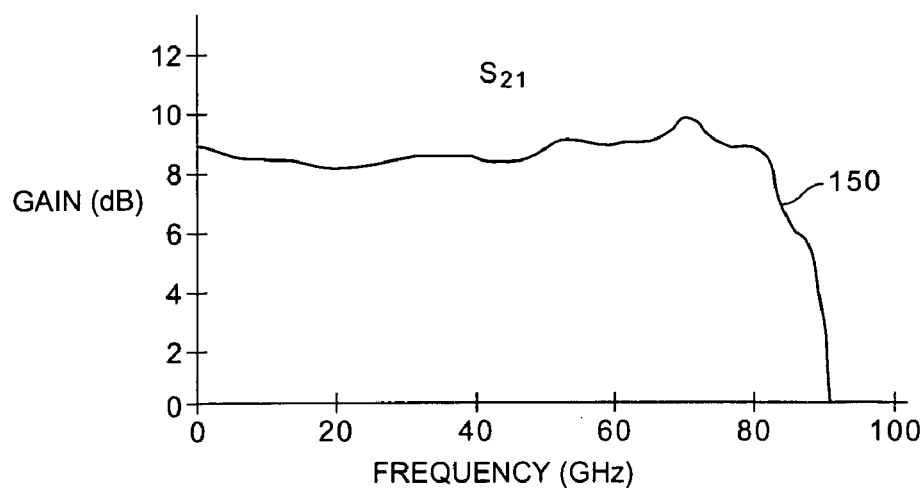
FIG. 4A is a plot of gain ($S_{21}$) versus frequency for a single TWA chip used in the distributed amplifier shown in FIG. 3A.

FIG. 4A is a plot 150 of gain ($S_{21}$) versus frequency for a single distributed amplifier chip (e.g. TWA 55) used in the multi-stage amplifier 80 shown in FIG. 3A. The TWA had seven cascoded PHEMT active gain cells and achieved gain of about 8 to 10 dB up to about 82 GHz. The integrated resistors (see FIG. 2, ref. nums. 60, 64) were about 1,000 ohms each and the integrated capacitor (see FIG. 2, ref. num. 62) was about 700 fF.

Figure 4B:
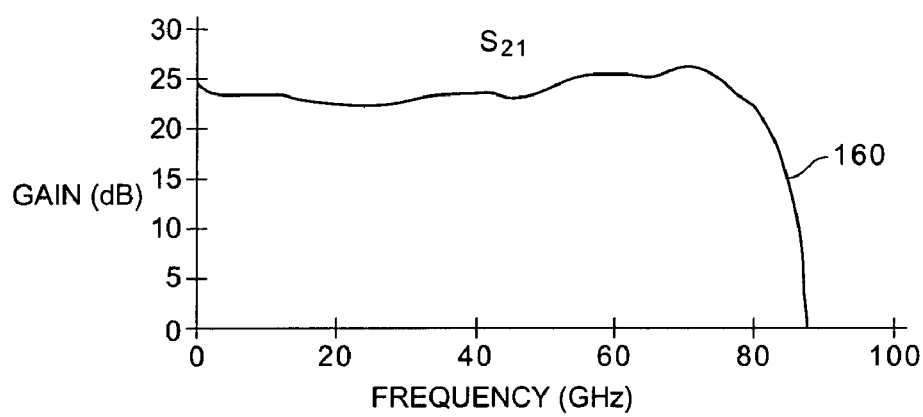
FIG. 4B is a plot of gain ($S_{21}$) versus frequency for the distributed amplifier shown in FIG. 3A.

FIG. 4B is a plot 160 of gain ($S_{21}$) versus frequency for the multi-stage amplifier 80 shown in FIGS. 3A and 3B, i.e. the gain for all three amplifier stages. The x-axis (frequency) is the same for both plots, but note that the y-axis ($S_{21}$) is reduced to about $\frac{1}{3}^{rd}$ scale in FIG. 4B for convenience of illustration. The three-stage amplifier provided gain above 20 dB from DC to about 80 GHz. The multi-stage amplifier made efficient use of the individual amplifier stages, with the total gain of the distributed amplifier being about 2.7 times the gain of an individual amplifier stage.

Figure 4C:
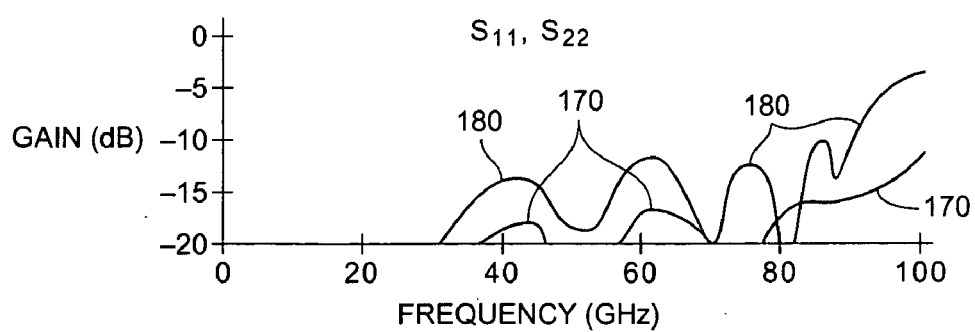
FIG. 4C shows a plot of input match ($S_{11}$) and output match ($S_{22}$) versus frequency for the distributed amplifier of FIG. 3A.

FIG. 4C shows a plot of input match ($S_{11}$) 170 and output match ($S_{22}$) 180 versus frequency for the multi-stage amplifier of FIG. 3A. Input match ($S_{11}$) 170 is below −15 dB to about 90 GHz and output match ($S_{22}$) 180 is at or below −10 dB to about 90 GHz. The reverse isolation ($S_{12}$) is about −40 dB or less in this frequency range. Of particular noteworthiness is the excellent matching at lower frequencies, indicating the suitability of the multi-stage amplifier 80 for applications needing high gain over a very wide frequency range.

The high-impedance level-shifting resistive network in combination with the integrated capacitor provided high gain down to true DC, and also provided high gain to very high frequencies. Such high gain over such a wide frequency range is a significant improvement over multi-stage amplifiers using conventional inter-stage coupling and/or level shifting. Additionally, the gain ripple was less than 4 dB from DC to 75 GHz, and the output power of the three-stage distributed amplifier was not less than 12 dBm from DC to 75 GHz.

Using a high-impedance resistive level-shifting network allows DC coupling of amplifiers with almost no degradation to the high-frequency performance of the amplifier. The gate bias voltage of the amplifier stage can be selected by changing the gate bias voltage $V_{G2}$, allowing the amplifier input to be connected to a wide range of DC levels. The level-shifting network also allows the drain bias current for a stage to be provided through both the output termination resistor for that stage and the input termination resistor of the following stage, thereby reducing the power dissipation and operating temperature of the output termination resistor.

While the preferred embodiments of the present invention have been illustrated in detail, it should be apparent that modifications and adaptations to these embodiments might occur to one skilled in the art. For example, single-ended amplifiers have been used to illustrate specific embodiments of the invention, but embodiments of the invention also use differential amplifiers. Therefore, the scope of the present invention is not limited by the illustrative embodiments above, and is set forth in the following claims.

What is claimed is:

1. An amplifier comprising:
    a first amplifier stage having
        a drain,
        an output termination resistor, and
        a first output configured to be coupled to a first bias supply through the output termination resistor to provide a first portion of a drain current to the first amplifier stage; and a second amplifier stage having
an input termination resistor,
an input coupled to the first output and configured to be coupled to the first bias supply through the input termination resistor to provide a second portion of the drain current to the first amplifier stage,
a first integrated resistor,
a second integrated resistor,
an integrated capacitor, and
a gate coupled to the input through the first integrated resistor in parallel with the integrated capacitor, the gate being configured to be coupled to a gate bias supply through the second integrated resistor.

2. The amplifier of claim 1 wherein the amplifier has a characteristic impedance and the first integrated resistor has a first resistance at least five times the characteristic impedance.

3. The amplifier of claim 2 wherein the second integrated resistor has a second resistance essentially equal to the first resistance.

4. The amplifier of claim 2 wherein the second integrated resistor has a second resistance less than the first resistance.

5. The amplifier of claim 1 wherein a current flows through the first integrated resistor when the amplifier is coupled to the first bias supply and to the gate bias supply, and a gate current flowing through the gate of the second amplifier stage is less than 2% of the current.

6. The amplifier of claim 1 wherein the second amplifier stage comprises a distributed amplifier.

7. The amplifier of claim 6 wherein the distributed amplifier comprises a traveling wave amplifier.

8. The amplifier of claim 1 wherein the first integrated resistor has a first resistance between about 250 ohms and about 1000 ohms, and the second integrated resistor has a second resistance between about 250 ohms and about 1000 ohms.

9. The amplifier of claim 1 wherein coupling between the input and the gate is primarily through the first integrated resistor in a low-frequency range, and is primarily through the integrated capacitor in a high-frequency range, the integrated capacitor having a capacitance, the first integrated resistor having a first resistance, and the second integrated resistor having a second resistance chosen so that gain of the amplifier varies less than about 1 dB in a transition band between the low-frequency range and the high-frequency range.

10. The amplifier of claim 9 wherein the low-frequency range extends down to direct-current.

11. The amplifier of claim 1 wherein the first integrated capacitor has a capacitance chosen to form a capacitive divider at the gate with an input capacitance of the gate.

12. The amplifier of claim 11 wherein the capacitance is approximately equal to the input capacitance.

13. The amplifier of claim 12 wherein the first integrated resistor has a first resistance and the second integrated resistor has a second impedance, the first impedance being approximately equal to the second impedance.

14. The amplifier of claim 1 wherein the first amplifier stage is a first traveling wave amplifier and the second amplifier stage is a second traveling wave amplifier.

15. A amplifier comprising:
a first distributed amplifier having
a first input configured to be coupled to a first gate bias supply,
a first gate coupled to the first input,
a first integrated output termination resistor, and
a first output configured to be coupled to an output bias supply through the first integrated output termination resistor; and
a second distributed amplifier having
a second integrated input termination resistor,
a second input coupled to the first output and configured to be coupled to the output bias supply through the second input termination resistor,
a first integrated resistor having a first resistance greater than at least five times a characteristic impedance of the amplifier,
a second integrated resistor having a second resistance,
a first integrated capacitor,
a second gate being coupled to the second input through the first integrated resistor in parallel with the first integrated capacitor, and configured to be coupled to a second gate bias supply through the second integrated resistor,
a second integrated output resistor, and
a second output configured to be coupled to the output bias supply through the second integrated output resistor, wherein the first resistance and second resistance are selected to provide a current from the second input to the second gate bias supply of at least fifty times a gate current.

16. The amplifier of claim 15 wherein the first distributed amplifier comprises a first traveling wave amplifier and the second distributed amplifier comprises a second traveling wave amplifier.

17. The amplifier of claim 15 wherein the first distributed amplifier is embodied in a first semiconductor chip and the second distributed amplifier is embodied in a second semiconductor chip, the first semiconductor chip being essentially identical to the second semiconductor chip.

18. The amplifier of claim 15 further comprising
a third distributed amplifier having
a third integrated input termination resistor,
a third input coupled to the second output and configured to be coupled to the output bias supply through the third input termination resistor,
a third integrated resistor having a third resistance greater than at least five times a characteristic impedance of the amplifier,
a fourth integrated resistor having a fourth resistance,
a second integrated capacitor,
a third gate being coupled to the third input through the third integrated resistor in parallel with the second integrated capacitor, and configured to be coupled to the second gate bias supply through the second integrated resistor,
an output coupling capacitor,
a third integrated output resistor configured to be coupled to ground through the output coupling capacitor, and
a third output configured to be coupled to a second output bias supply.

19. The amplifier of claim 18 wherein the first distributed amplifier provides a first gain, the second distributed amplifier provides a second gain and the third distributed amplifier provides a third gain, a total gain of the amplifier being at least 90% of a sum of the first gain, second gain and third gain from direct-current to at least 75 GHz.

* * * * *